(12) United States Patent
Lyne

(10) Patent No.: US 6,285,560 B1
(45) Date of Patent: Sep. 4, 2001

(54) METHOD FOR INCREASING DEVICE RELIABILITY BY SELECTIVELY DEPOPULATING SOLDER BALLS FROM A FOOT PRINT OF A BALL GRID ARRAY (BGA) PACKAGE, AND DEVICE SO MODIFIED

(75) Inventor: Kevin Lyne, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/400,349

(22) Filed: Sep. 20, 1999

(51) Int. Cl.$^7$ ...................................................... H05K 7/02
(52) U.S. Cl. .......................... 361/760; 361/783; 361/777; 361/767; 174/260; 174/261; 174/263; 174/266; 257/737; 257/738; 257/778; 257/774; 257/698; 257/786
(58) Field of Search ...................................... 361/718, 764, 361/767, 760, 783, 820, 771, 777, 768, 748–749; 438/108, 125, 638, 106; 29/840, 846, 830–831, 852; 257/737–738, 778, 774, 698, 786; 174/250

(56) References Cited

U.S. PATENT DOCUMENTS

| | | |
|---|---|---|
| 5,324,985 | 6/1994 | Hamada et al. . |
| 5,424,492 * | 6/1995 | Petty et al. ............................. 174/250 |
| 5,491,364 | 2/1996 | Brandenburg et al. . |
| 5,729,894 | 3/1998 | Rostoker et al. . |
| 5,981,873 * | 11/1999 | Heo ...................................... 174/52.2 |
| 6,133,134 * | 10/2000 | Mehr .................................... 438/612 |

* cited by examiner

Primary Examiner—Jeffrey Gaffin
Assistant Examiner—Thanh Y. Tran
(74) Attorney, Agent, or Firm—Ronald O. Neerings; Wade James Brady, III; Frederick J. Telecky, Jr.

(57) ABSTRACT

A routing technique for improving device reliability by selectively depopulating solder balls (12) (and their respective solder ball pads (34), vias (32) and traces or lines (30)) from a conventional foot print of a ball grid array (BGA) package, and a BGA package so modified. The routing technique uses the gap resulting from the depopulated solder balls as additional space for routing traces or lines from solder ball pads to an exterior surface of a substrate (14) upon which a semiconductor die (20) is mounted. An advantage of the present invention is that it permits the retention of an optimum via diameter while increasing the number of solder balls on ever shrinking packages, thereby increasing device reliability.

25 Claims, 7 Drawing Sheets

THIS IS THE 151GHZ CASE (152-ONE BALL IN A1 CORNER NOT SHOWN BELOW). THE DESIGN RULE USED FOR THIS PACKAGE WAS LINE/SPACE 28/42.

0.50mm PITCH-LARGEST POSSIBLE MATRIX WITH N-1 ROW DEPOPULATED

| | | | |
|---|---|---|---|
| VIACAP RULE | 50 | um | 18UM RULE-LINE/SPACE 20/30 |
| BODY | 10 | mm | 25UM RULE-LINE/SPACE 28/42 |
| MATRIX | 18 | | |
| BALL PITCH | 500 | um | |

*ASSUMED RELATIVE TO STANDARD VIAS

OVERLAP OF VIACAP FROM EDGE OF VIA

TOTAL 152

| ROW N- | BALLSITES/ROW | BALLS DEPOP PER SIDE | REMAINING BALLS ON ROW | NUMBER OF REDUCED SIZE VIAS/SIDE | STANDARD VIA SIZE (um) | REDUCED VIA SIZE (um) | LINE WIDTH (um) | SPACE WIDTH (um) | TRACES BETWEEN STANDARD VIAS | TRACES PER REDUCED VIA | TRACES PER DEPOP BALL* | MAX TRACES (BALLS INSIDE) | MAX TRACES OK? | TOTAL POSSIBLE BALLS | ACTUAL BALLS INSIDE | DELTA |
|---|---|---|---|---|---|---|---|---|---|---|---|---|---|---|---|---|
| 0 | 68 | 6 | 44 | 0 | 280 | 280 | 28 | 42 | 1 | 1 | 8 | 212 | 44 | 44 | 108 | 104 |
| 1 | 60 | 14 | 4 | 0 | 280 | 280 | 28 | 42 | 1 | 1 | 8 | 396 | 4 | 4 | 104 | 292 |
| 2 | 52 | 0 | 52 | 0 | 280 | 280 | 28 | 42 | 1 | 1 | 8 | 52 | 52 | 52 | 52 | 0 |
| 3 | 44 | 0 | 44 | 0 | 280 | 280 | 28 | 42 | 1 | 1 | 8 | 44 | 44 | 44 | 8 | 36 |
| 4 | 36 | 7 | 8 | 0 | 280 | 280 | 28 | 42 | 1 | 1 | 8 | 204 | 8 | 8 | 0 | 204 |
| 5 | 28 | 7 | 0 | 0 | 280 | 280 | 28 | 42 | 1 | 1 | 8 | 196 | 0 | 0 | 0 | 196 |
| 6 | 20 | 5 | 0 | 0 | 280 | 280 | 28 | 42 | 1 | 1 | 8 | 140 | 0 | 0 | 0 | 140 |
| 7 | 12 | 3 | 0 | 0 | 280 | 280 | 28 | 42 | 1 | 1 | 8 | 84 | 0 | 0 | 0 | 84 |
| 8 | 4 | 1 | 0 | 0 | 280 | 280 | 28 | 42 | 1 | 1 | 8 | 28 | 0 | 0 | 0 | 28 |
| 9 | 0 | 0 | 0 | 0 | 280 | 280 | 28 | 42 | 1 | 1 | 8 | 0 | 0 | 0 | 0 | 0 |
| 10 | 0 | 0 | 0 | 0 | 280 | 280 | 28 | 42 | 1 | 1 | 8 | 0 | 0 | 0 | 0 | 0 |

TOTAL 152      TRUE TOTAL 152

0.50mm PITCH-LARGEST POSSIBLE MATRIX WITH N-1 ROW DEPOPULATED

| | | |
|---|---|---|
| VIACAP RULE | 50 um | 18UM RULE-LINE/SPACE |
| BODY | 10 mm | 25UM RULE-LINE/SPACE |
| MATRIX | 17 | 20/30 |
| BALL PITCH | 500 um | 28/42 |
| | | TOTAL 240 |

OVERLAP OF VIACAP FROM EDGE OF VIA
*ASSUMED RELATIVE TO STANDARD VIAS

| ROW N- | BALLSITES/ROW | BALLS DEPOP PER SIDE | REMAINING BALLS ON ROW | NUMBER OF REDUCED SIZE VIAS/SIDE | STANDARD VIA SIZE (um) | REDUCED VIA SIZE (um) | LINE WIDTH (um) | SPACE WIDTH (um) | TRACES BETWEEN STANDARD VIAS | TRACES PER REDUCED VIA | TRACES PER DEPOP BALL* | MAX TRACES (BALLS INSIDE) | MAX TRACES OK? | TOTAL POSSIBLE BALLS | ACTUAL BALLS INSIDE | DELTA |
|---|---|---|---|---|---|---|---|---|---|---|---|---|---|---|---|---|
| 0 | 64 | 3 | 52 | 0 | 280 | 280 | 18 | 28 | 2 | 2 | 12 | 224 | 52 | 52 | 188 | 36 |
| 1 | 56 | 2 | 48 | 0 | 280 | 280 | 18 | 28 | 2 | 2 | 12 | 176 | 48 | 48 | 140 | 36 |
| 2 | 48 | 2 | 40 | 0 | 280 | 280 | 18 | 28 | 2 | 2 | 12 | 160 | 40 | 40 | 100 | 60 |
| 3 | 40 | 1 | 36 | 0 | 280 | 280 | 18 | 28 | 2 | 2 | 12 | 112 | 36 | 36 | 64 | 48 |
| 4 | 32 | 0 | 32 | 0 | 280 | 280 | 18 | 28 | 2 | 2 | 12 | 64 | 32 | 32 | 32 | 32 |
| 5 | 24 | 0 | 24 | 0 | 280 | 280 | 18 | 28 | 2 | 2 | 12 | 48 | 24 | 24 | 8 | 40 |
| 6 | 16 | 4 | 0 | 0 | 280 | 280 | 18 | 28 | 2 | 2 | 12 | 160 | 0 | 0 | 8 | 152 |
| 7 | 8 | 0 | 8 | 0 | 280 | 280 | 18 | 28 | 2 | 2 | 12 | 16 | 8 | 8 | 0 | 16 |
| 8 | 0 | 0 | 0 | 0 | 280 | 280 | 18 | 28 | 2 | 2 | 12 | 0 | 0 | 0 | 0 | 0 |
| 9 | 0 | 0 | 0 | 0 | 280 | 280 | 18 | 28 | 2 | 2 | 12 | 0 | 0 | 0 | 0 | 0 |
| 10 | 0 | 0 | 0 | 0 | 280 | 280 | 18 | 28 | 2 | 2 | 12 | 0 | 0 | 0 | 0 | 0 |
| TOTAL 240 | | | | | | | | | | | | TRUE TOTAL 240 | | | | |

FIG. 12

0.50mm PITCH-LARGEST POSSIBLE MATRIX WITH N-1 ROW DEPOPULATED

| | | |
|---|---|---|
| VIACAP RULE | 50 um | 18UM RULE-LINE/SPACE 20/30 |
| BODY | 12 mm | 25UM RULE-LINE/SPACE 28/42 |
| MATRIX | 21 | |
| BALL PITCH | 500 um | OVERLAP OF VIACAP FROM EDGE OF VIA |
| | | *ASSUMED RELATIVE TO STANDARD VIAS |

TOTAL 288

| ROW N- | BALLSITES/ROW | BALLS DEPOP PER SIDE | REMAINING BALLS ON ROW | NUMBER OF REDUCED SIZE VIAS/SIDE | STANDARD VIA SIZE (um) | REDUCED VIA SIZE (um) | LINE WIDTH (um) | SPACE WIDTH (um) | TRACES BETWEEN STANDARD VIAS | TRACES PER REDUCED VIA | TRACES PER DEPOP BALL* | MAX TRACES (BALLS INSIDE) | MAX TRACES OK? | TOTAL POSSIBLE BALLS | ACTUAL BALLS INSIDE | DELTA |
|---|---|---|---|---|---|---|---|---|---|---|---|---|---|---|---|---|
| 0 | 80 | 8 | 48 | 0 | 280 | 280 | 18 | 28 | 2 | 2 | 12 | 416 | 48 | 48 | 240 | 176 |
| 1 | 72 | 1 | 68 | 0 | 280 | 280 | 18 | 28 | 2 | 2 | 12 | 176 | 68 | 68 | 172 | 4 |
| 2 | 64 | 0 | 64 | 0 | 280 | 280 | 18 | 28 | 2 | 2 | 12 | 128 | 64 | 64 | 108 | 20 |
| 3 | 56 | 0 | 56 | 0 | 280 | 280 | 18 | 28 | 2 | 2 | 12 | 112 | 56 | 56 | 52 | 60 |
| 4 | 48 | 12 | 0 | 0 | 280 | 280 | 18 | 28 | 2 | 2 | 12 | 480 | 0 | 0 | 52 | 428 |
| 5 | 40 | 10 | 0 | 0 | 280 | 280 | 18 | 28 | 2 | 2 | 12 | 400 | 0 | 0 | 52 | 348 |
| 6 | 32 | 1 | 28 | 0 | 280 | 280 | 18 | 28 | 2 | 2 | 12 | 96 | 28 | 28 | 24 | 72 |
| 7 | 24 | 0 | 24 | 0 | 280 | 280 | 18 | 28 | 2 | 2 | 12 | 48 | 24 | 24 | 0 | 48 |
| 8 | 16 | 4 | 0 | 0 | 280 | 280 | 18 | 28 | 2 | 2 | 12 | 160 | 0 | 0 | 0 | 160 |
| 9 | 8 | 2 | 0 | 0 | 280 | 280 | 18 | 28 | 2 | 2 | 12 | 80 | 0 | 0 | 0 | 80 |
| 10 | 0 | 0 | 0 | 0 | | | | | | | | 0 | | | | 0 |
| TOTAL 288 | | | | | | | | | | | TRUE TOTAL 288 | | | | |

METHOD FOR INCREASING DEVICE RELIABILITY BY SELECTIVELY DEPOPULATING SOLDER BALLS FROM A FOOT PRINT OF A BALL GRID ARRAY (BGA) PACKAGE, AND DEVICE SO MODIFIED

FIELD OF THE INVENTION

The present invention relates to the field of integrated circuit devices. More specifically, the present invention relates to a method for increasing device reliability by selectively depopulating solder balls from a foot print of a ball grid array (BGA) package to increase the routability of the package substrate, and a BGA package so modified.

BACKGROUND OF THE INVENTION

The parallel drive towards total cost reduction and miniaturization has, in recent years, given rise to an increasing emphasis on very small IC package solutions. This is particularly evident in consumer based end equipment such as camcorders and mobile telephone handsets. Despite a formal definition, packages whose area is similar to that of the IC they encapsulate are loosely referred to as chip scale packages (CSPs).

CSPs are in many ways an ideal solution to the cost reduction and miniaturization requirement. They offer enormous area reductions compared with quad flat package, and have increasing potential to do so without adding system level cost. In the best case, CSPs are able to compete today, on a cost per terminal basis, with quad flat packages. For example, various CSPs from Texas Instruments are now available at cost parity with thin quad flat packages.

Figure 1:
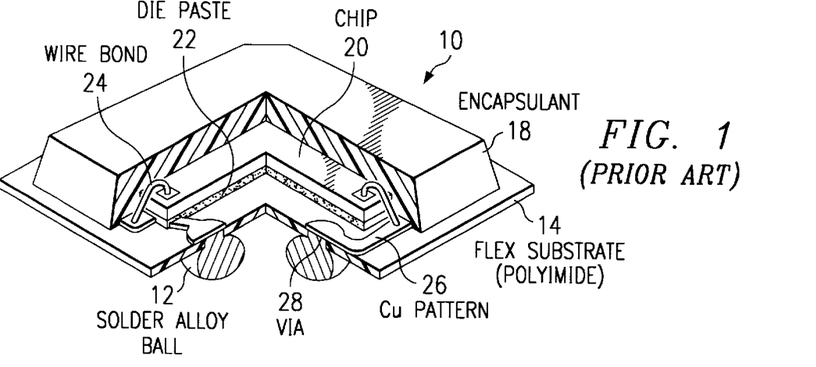
FIG. 1 is an exploded sectional view of a ball grid array (BGA) package.

Texas Instruments produces a polyimide-based family of CSPs known as MicroStarBGA™ (see FIG. 1). This CSP 10, like most others, uses solder alloy balls 12 as the interconnection between the package substrate 14 and the board on which the packages is soldered. As with all such packages, the solder balls formed between the package and the board are susceptible to fatigue when exposed to cyclic ambient temperature conditions.

JEDEC and EIAJ are increasingly documenting fine pitch BGA industry standards. The finest pitch standard that is currently widely recognized is 0.50 mm pitch. However, broad acceptance and use of 0.50 mm pitch CSPs is still very limited, due to the following reasons:

1) Lack of package availability from a broad range of suppliers.
2) Lack of package reliability data, and concerns that reliability will not meet the requirements of even the consumer markets.
3) The printed circuit board (PCB) requirements for mounting such fine pitch packages are very demanding. There is limited availability of such boards, and in many cases, the higher PCB cost is prohibitive.
4) Lack of experience on the part of most SMT assembly operations in manufacturing with such fine pitch BGAs.
5) Belief that 0.50 mm pitch CSP component cost is inherently higher, on a cost per terminal basis, than for example, 0.80 mm pitch CSPs.

Figure 2:
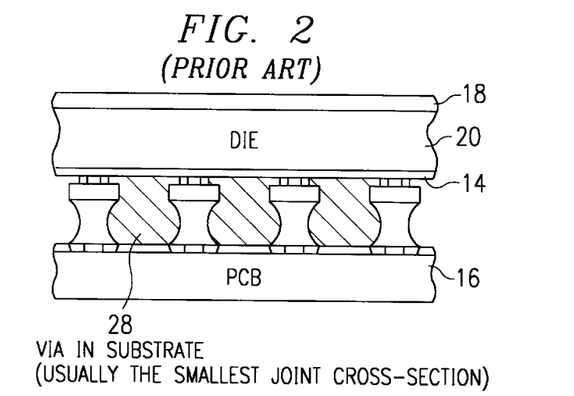
FIG. 2 is a cross sectional view of a ball grid array (BGA) package mounted on a printed wiring board (PWB).

Clearly, key to the successful adoption of a package that has to meet the twin goals of system cost reduction and miniaturization, is the package reliability. As the ball pitch shrinks, it becomes more and more difficult to meet reliability specifications, due to the ball joint fatigue phenomenon mentioned in the introduction. Both the size (volume) and shape of the solder ball influence reliability. The weakest link in the system is normally the point of smallest cross-section in the solder joint, which is via (28), as seen in FIG. 2.

Figure 3:
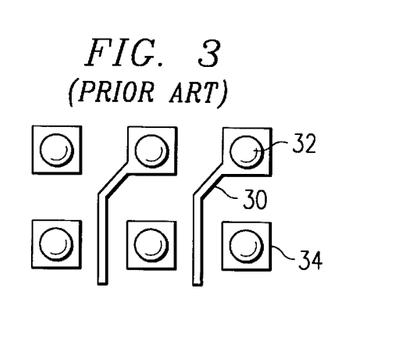
FIG. 3 illustrates the current optimum design for vias, solder ball pads and traces or lines.

Thus a major challenge in the design of the CSP substrate is to optimize the diameter of this solder via. However, as the ball density on the package increases (more balls on more rows, at finer pitch), substrate routing density also increases, often leading to a package design of inherent lower reliability. To demonstrate this, the current optimum design for reliability, as shown in FIG. 3, is:

| | |
|---|---|
| Ball (12) pitch | 500 um |
| Line (30)/Space | 28/42 um |
| Via (32) diameter | 280 um |
| Solder ball pad (34) diameter | 380 um |

NB pad size is via size + 100 um.

These optimum rules, based on design for reliability, allow only one trace or line (30) to pass between adjacent balls (12). This is important since in CSP packages, since a line or trace (30) must extend from each solder ball pad (34) to an exterior edge of the substrate (14) (e.g., to facilitate electrolytic plating). Such restriction of limiting one line or trace between adjacent balls will limit the total number of balls that may actually be implemented in a matrix type ball grid array since there will be a limitation on how many traces or lines may actually extend out to an exterior surface of the substrate.

Figure 4:
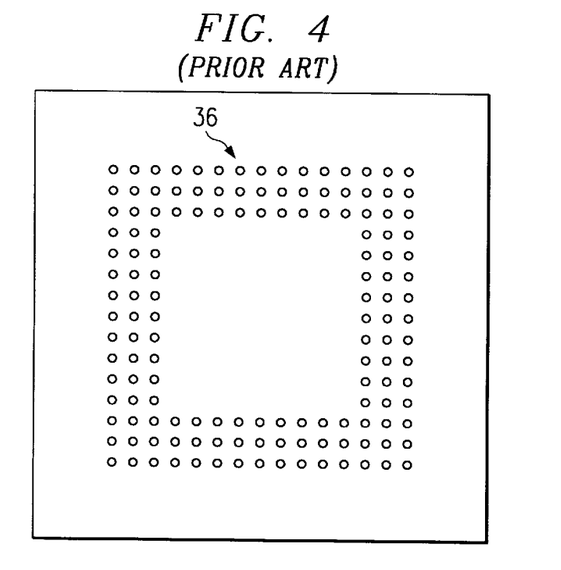
FIG. 4 illustrates a conventional ball grid array footprint that can be attained when current optimum design rules are compromised.

FIG. 4 discloses a conventional ball footprint (regular pattern of 3 row of balls) having 144 balls (on a 0.5 mm pitch) on a 10×10 mm package body. To achieve this dense routing, a designer has to compromise. There are typically three options:

1) Tighten the line/space design rule for the connection traces. This can add cost or may be beyond the capability of the substrate technology. *
2) Reduce the via diameter. This will reduce the fatigue life of the solder joint.
3) Reduce the minimum overlap of the ball pad to via (see FIG. 4). This has negative reliability implications, as it will effect the moisture sensitivity of the package.

* NB. The line/space design rules can be improved upon by reducing the copper film thickness. This will not be discussed since the principles explained here are applicable to enhance the package reliability for any given metal film thickness. The most common compromise, when faced with having to increase routing density, is to use the tightest line/space rule available for the given substrate technology, and then to reduce the ball via diameter. This is demonstrated in the example in FIG. 5, and is the design used for the footprint in FIG. 4.

Figure 5:
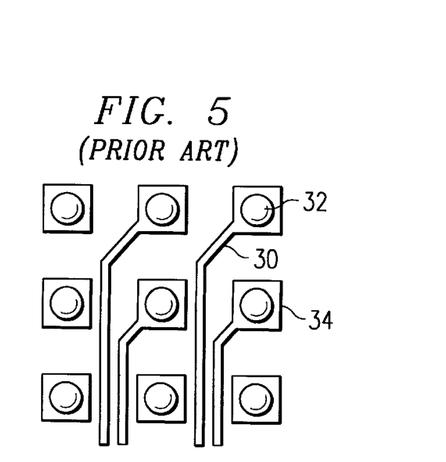
FIG. 5 illustrates a routing pattern for three fill rows of balls in the ball grid array footprint of FIG. 4.

FIG. 5 discloses a routing pattern for 3 full rows of balls, in which:

| | |
|---|---|
| Ball (12) pitch | 500 um |
| Line (30)/Space | 28/42 um |
| Via (32) diameter | 218 um |
| Solder ball pad (34) diameter | 318 um |

Thus, in the case of FIG. 4 (and by implication FIG. 5), the designer chose option 2. In order to allow two traces to route between adjacent balls, the via diameter had to be reduced from 280 um to 218 um, which is a violation of the optimum design rules which call for a via diameter of 280 um. There are significant reliability implications of such a modification or change, as is well known in the art.

SUMMARY OF THE INVENTION

A routing technique for improving device reliability by selectively depopulating solder balls (and their respective solder ball pads, vias and traces or lines) from a conventional foot print of a ball grid array (BGA) package, and a BGA package so modified. The routing technique uses the gap resulting from the depopulated solder balls as additional space for routing traces or lines from solder ball pads to an exterior surface of a substrate upon which a semiconductor die is mounted. An advantage of the present invention is that it permits the retention of an optimum via diameter while increasing the number of solder balls on ever shriking packages, thereby increasing device reliability.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE INVENTION

Taking a radical look at footprint design, it is possible to overcome many of the restrictions and compromises discussed above. Using the principle of selective ball depopulation, it is possible to return to the optimum design rule for reliability and match the ball density of the conventional footprint design. However, the complexity of the footprint design has now increased significantly, especially as (as far as the author is aware) there are no available software design tools available today to handle this.

As shown in FIG. 3, a 280 um via (32) only permits one trace between adjacent balls (12). If however, we depopulate a ball (including its associated via (32), solder ball pad (34) and trace or line (30)), we can now place up to 8 traces or lines (30) when using the 25 um rule-line/space 28/42 (or up to 13 traces or lines (30) when using the 18 um rule-line/space 20/30—these numbers will change when other rule-line/space numbers are selected) in the resulting gap between 2 adjacent balls. By careful selection of these depopulated balls, it is possible to route as many, if not more total balls with the optimum design rule (optimum via diameter), as compared to the conventional footprint with compromised design rules (e.g., via diameter of less than 280 um). This design concept is called 'Smart-Foot'™.

Figure 6:
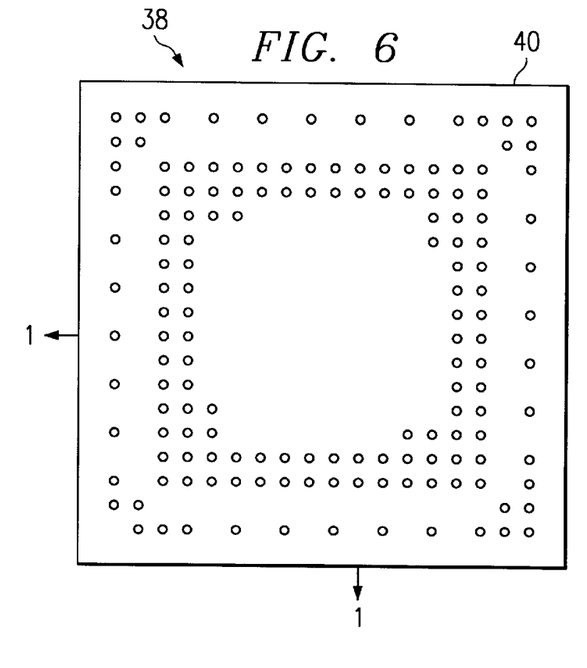
FIG. 6 illustrates a ball grid array footprint with selective ball depopulation, according to one embodiment of the invention.

FIG. 6 illustrates a footprint (38), with selective ball depopulation. More specifically, the selective ball depopulated footprint (38) shown in FIG. 6 is a footprint for the TI 151 GHZ uStarBGA™, package, which comprises 151 balls on a 10×10 mm body or substrate (40). The TI 151 GHZ uStarBGA™, package modeling began with the selection of a 10×10 mm body or substrate (based upon combination of size of die and size limitation request of customer). Next a ball grid matrix of 18 (18×18) was selected. Recall from the previous discussions that it is not possible to utilize a full 18×18 ball grid array having 324 balls (or any other grid of substantial size for that matter), using optimum design rules, since a trace or line for each viable die pad must extend to the outer surface of the substrate and there is not enough room between all of the 0.28 mm diameter vias to accommodate all of the traces. The trick is to intelligently decide which balls to depopulate in order to arrive at the desired footprint. So, in the embodiment of FIGS. 6 and 8, a standard size via of 280 um, a line width of 28 um—which allows one trace between standard vias and up to 8 traces between two vias having a depopulated via spaced therebetween.

Figure 7:
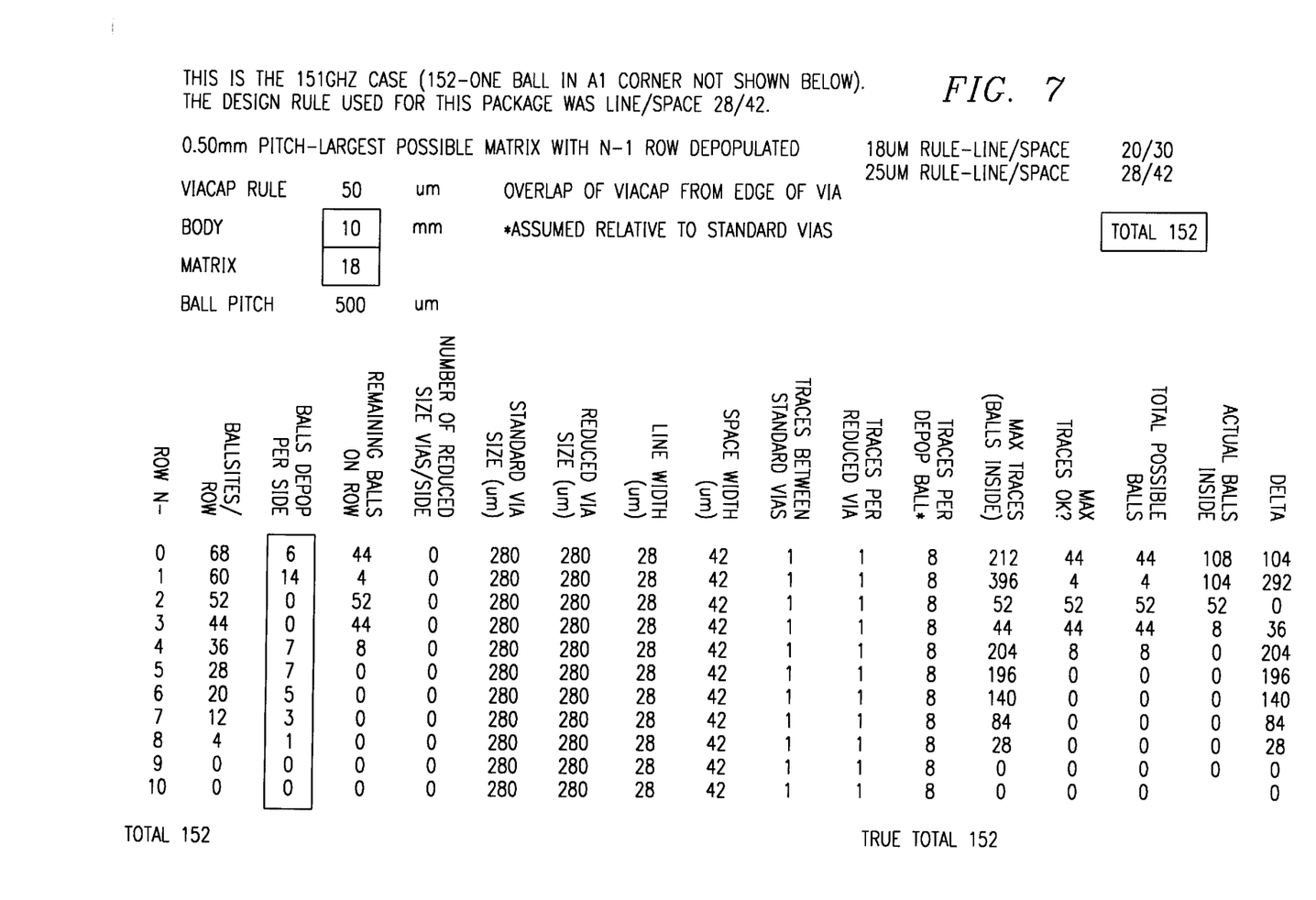
FIG. 7 illustrates the modeling results for the ball grid array footprint of FIGS. 5 and 6.
Figure 8:
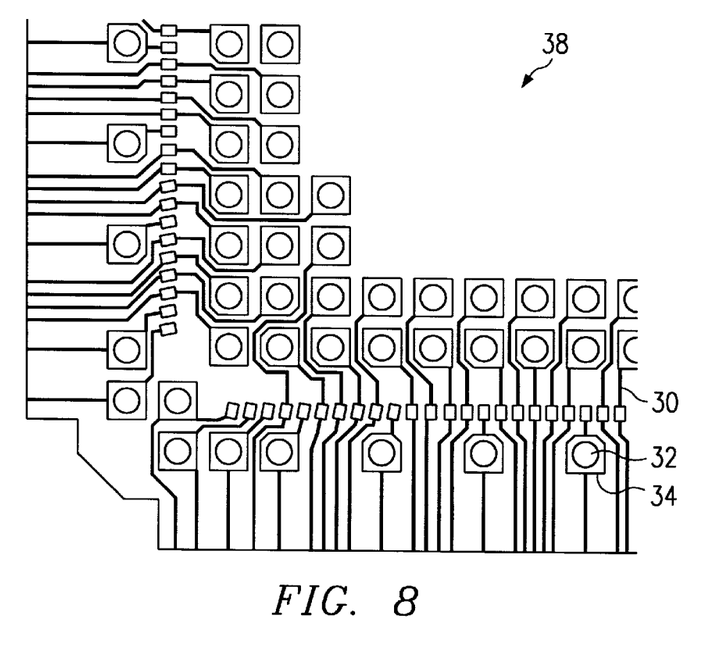
FIG. 8 illustrates a routing pattern of a portion of the footprint of FIG. 6.

Using the above criteria, the outer most row (row 0) on the gird (having four identical sides) has a maximum potential of 68 ball sites with 6 balls being depopulated on each of the four sides of the outermost row, resulting in a total number of 44 balls remaining for row 0. The next row in on the grid (row 1) has a maximum potential of 60 ball sites with 14 balls being depopulated on each of the four sides of the row, resulting in a total number of 4 balls remaining for row 1. The next row in on the grid (row 2) has a maximum potential of 52 ball sites with 0 balls being depopulated on each of the four sides of the row, resulting in a total number of 52 balls remaining on row 2. The next row in on the grid (row 3) has a maximum potential of 44 ball sites with 0 balls being depopulated on each of the four sides of the row, resulting in a total number of 44 balls remaining on row 3. The next row in on the grid (row 4) has a maximum potential of 36 ball sites with 7 balls being depopulated on each of the four sides of the row, resulting in a total number of 44 balls remaining on row 3. No additional rows of ball were selected. Adding all of the balls together results in a package having a footprint with 152 balls (reduced to 151 balls when the ball in the lower left had corner of row 0 is depopulated), as can be seen in FIG. 7, which illustrates the results of the selection for this footprint. The 151 balls actually selected are not the maximum or minimum that can be obtained for a 10×10 mm package using the selective depopulation of the present invention. Nevertheless, 151 balls is substantially more than can be obtained on a 10×10 mm substrate using conventional footprint design techniques requiring the optimum 280 um via size. FIG. 8 illustrates a routing pattern of a portion of the footprint of FIG. 6 along section lines 1-1.

Figure 9:
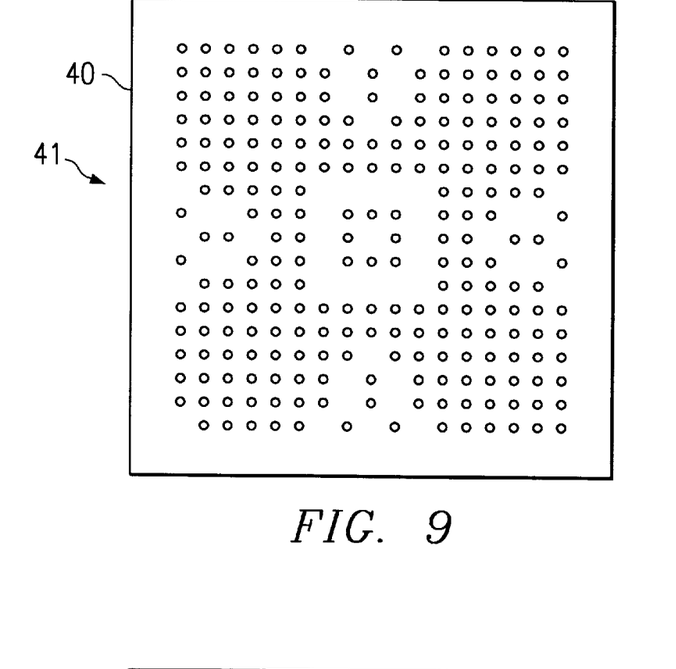
FIG. 9 illustrates a ball grid array footprint with selective ball depopulation, according to another embodiment of the invention.

FIG. 9 illustrates another footprint (41), with selective ball depopulation. More specifically, the selective ball depopulated footprint (41) shown in FIG. 9 is a footprint for the TI 240 GHZ uStarBGA™, package, which comprises 240 balls on a 10×10 mm body or substrate (40). The TI 240 GHZ uStarBGA™, package modeling began with the selection of a 10x10 mm body or substrate (based upon combination of size of die and size limitation request of customer). Next a ball grid matrix of 17 (17×17) was selected. In the embodiment of FIG. 9, a standard size via of 280 um, a line width of 18 um (less than current optimum design rules)—which allows two traces between standard vias and up to 12 traces between two vias having a depopulated via spaced therebetween.

Figure 10:
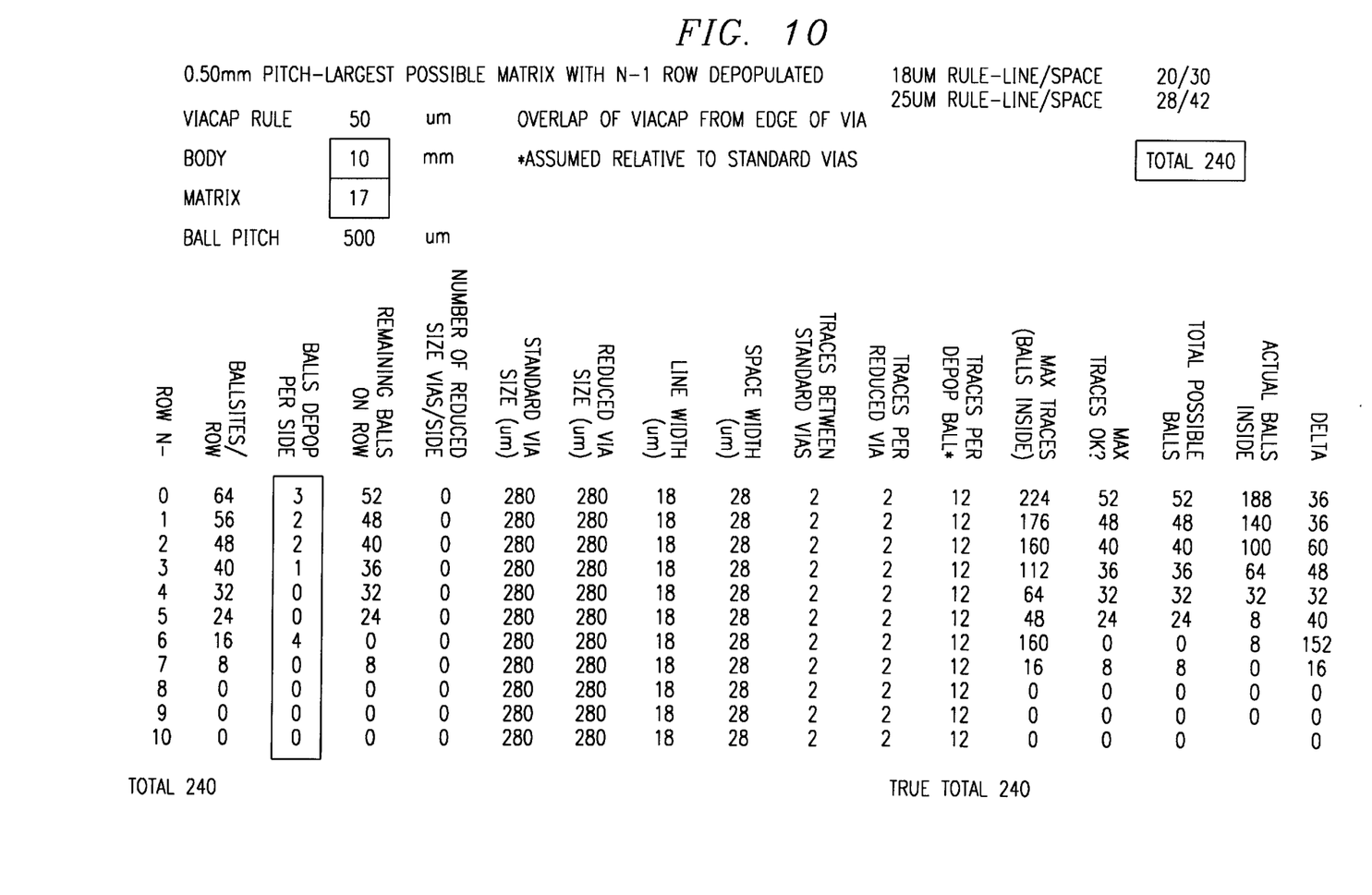
FIG. 10 illustrates the modeling results for the ball grid array footprint of FIG. 9.

Using the above criteria, the outer most row (row 0) on the gird (having four identical sides) has a maximum potential of 64 ball sites with 3 balls being depopulated on each of the four sides of the outermost row, resulting in a total number of 52 balls remaining for row 0. The next row in on the grid (row 1) has a maximum potential of 56 ball sites with 2 balls being depopulated on each of the four sides of the row, resulting in a total number of 48 balls remaining for row 1. The next row in on the grid (row 2) has a maximum potential of 48 ball sites with 2 balls being depopulated on each of the four sides of the row, resulting in a total number of 40 balls remaining on row 2. The next row in on the grid (row 3) has a maximum potential of 40 ball sites with 1 ball being depopulated on each of the four sides of the row, resulting in a total number of 36 balls remaining on row 3. The next row in on the grid (row 4) has a maximum potential of 32 ball sites with 0 balls being depopulated on each of the four sides of the row, resulting in a total number of 32 balls remaining on row 4. The next row in on the grid (row 5) has a maximum potential of 24 ball sites with 0 balls being depopulated on each of the four sides of the row, resulting in a total number of 24 balls remaining on row 5. The next row in on the grid (row 6) has a maximum potential of 16 ball sites with 4 balls being depopulated on each of the four sides of the row, resulting in a total number of 0 balls remaining on row 6. The next row in on the grid (row 7) has a maximum potential of 8 ball sites with 0 balls being depopulated on each of the four sides of the row, resulting in a total number of 8 balls remaining on row 7. No additional rows of ball were selected. Adding all of the balls together results in a package having a footprint with 240 balls, as can be seen in FIG. 10, which illustrates the results of the selection for this footprint. As the above-described 151 ball footprint example, the 240 balls actually selected are not the maximum or minimum that can be obtained for a 10×10 mm substrate using the selective depopulation of the present invention. As above, 240 balls is substantially more than can be obtained on a 10×10 mm package using conventional footprint design techniques requiring the optimum 280 um via size.

Figure 11:
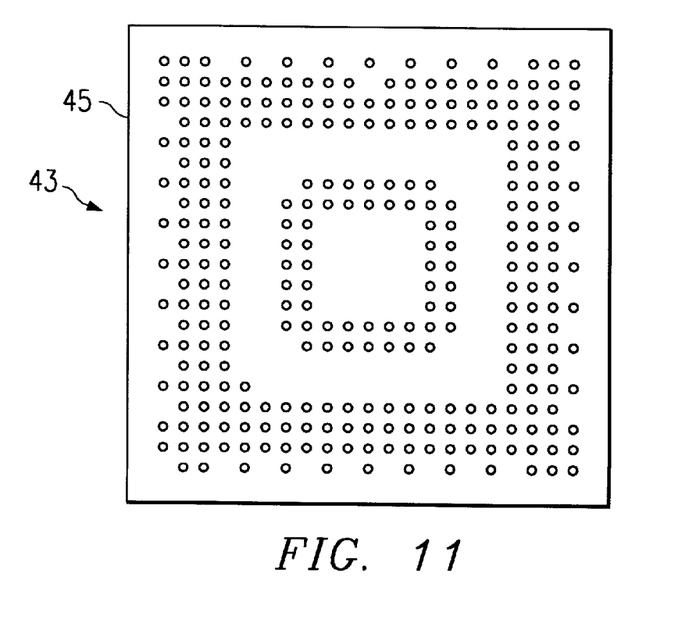
FIG. 11 illustrates a ball grid array footprint with selective ball depopulation, according to yet another embodiment of the invention.

FIG. 11 illustrates yet another footprint (43), with selective ball depopulation. More specifically, the selective ball depopulated footprint (43) shown in FIG. 11 is a footprint for the TI 288 GZG uStarBGA™, package, which comprises 288 balls on a 12×12 mm body or substrate (45). The TI 288 GZG uStarBGA™, package modeling began with the selection of a 12×12 mm body or substrate (based upon combination of size of die and size limitation request of customer). Next a ball grid matrix of 21 (21×21) was selected. In the embodiment of FIG. 11, a standard size via of 280 um, a line width of 18 um (less than current optimum design rules)—which allows two traces between standard vias and up to 12 traces between two vias having a depopulated via spaced therebetween.

Figure 12:
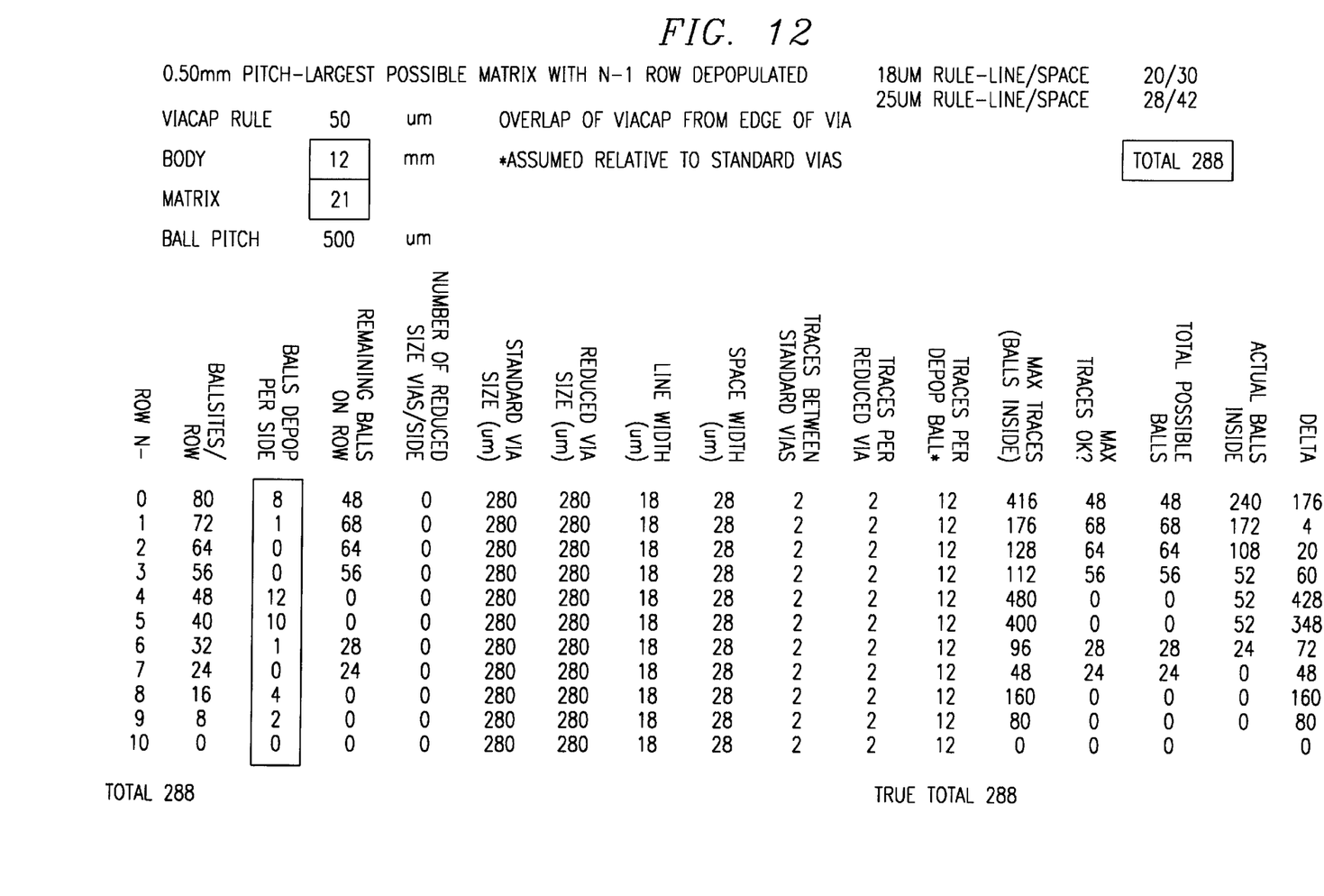
FIG. 12 illustrates the modeling results for the ball grid array footprint of FIG. 11.

Using the above criteria, the outer most row (row 0) on the gird (having four identical sides) has a maximum potential of 80 ball sites with 8 balls being depopulated on each of the four sides of the outermost row, resulting in a total number of 48 balls remaining for row 0. The next row in on the grid (row 1) has a maximum potential of 72 ball sites with 1 ball being depopulated on each of the four sides of the row, resulting in a total number of 68 balls remaining for row 1. The next row in on the grid (row 2) has a maximum potential of 64 ball sites with 0 balls being depopulated on each of the four sides of the row, resulting in a total number of 64 balls remaining on row 2. The next row in on the grid (row 3) has a maximum potential of 56 ball sites with 0 balls being depopulated on each of the four sides of the row, resulting in a total number of 56 balls remaining on row 3. The next row in on the grid (row 4) has a maximum potential of 48 ball sites with 12 balls being depopulated on each of the four sides of the row, resulting in a total number of 0 balls remaining on row 4. The next row in on the grid (row 5) has a maximum potential of 40 ball sites with 10 balls being depopulated on each of the four sides of the row, resulting in a total number of 0 balls remaining on row 5. The next row in on the grid (row 6) has a maximum potential of 32 ball sites with 1 ball being depopulated on each of the four sides of the row, resulting in a total number of 28 balls remaining on row 6. The next row in on the grid (row 7) has a maximum potential of 24 ball sites with 0 balls being depopulated on each of the four sides of the row, resulting in a total number of 24 balls remaining on row 7. The next row in on the grid (row 8) has a maximum potential of 16 ball sites with 4 balls being depopulated on each of the four sides of the row, resulting in a total number of 0 balls remaining on row 8. The next row in on the grid (row 9) has a maximum potential of 8 ball sites with 2 balls being depopulated on each of the four sides of the row, resulting in a total number of 0 balls remaining on row 9. No additional rows of ball were selected. Adding all of the balls together results in a package having a footprint with 288 balls, as can be seen in FIG. 12, which illustrates the results of the selection for this footprint. The 288 balls actually selected are not the maximum or minimum that can be obtained for a 12×12 mm substrate using the selective depopulation of the present invention. As above, 288 balls is substantially more than can be obtained on a 12×12 mm substrate using conventional footprint design techniques requiring the optimum 280 um via size.

Table 1 shows the results of the board level reliability (BLR) tests done on both the conventional and 'smart footprints'. Due to the heavy dependence of die size on reliability, the die in both cases was kept constant (6.0×6.0 mm). In order to focus on the package reliability, only failures in the package side of the joint are reported:

Board level reliability of conventional and 'Smart-Foot'™ packages.

TABLE 1

|  | Via Diameter (mm) | Sample Size | Cycles to first failure |
|---|---|---|---|
| Conventional Footprint | 0.212 | 28 | 550 |
| 'Smart-Foot' ™ Footprint | 0.280 | 31 | 1450 |

Other design and test features used for this test are as follows:

| | |
|---|---|
| Temperature range | −40/125 deg C. |
| Ramp time | 2–5 minutes |
| Dwell time | 11–13 minutes |
| Board land type | Copper, Ni/Au plated |
| Board material | FR4 |
| Board thickness | 0.80 mm |
| Land design | Non-soldermask defined |
| Land diameter | 0.20 mm * |

* Optimum diameter is 0.25–0.30 mm. The boards procured for this test did not meet the original specification.

Figure 13:
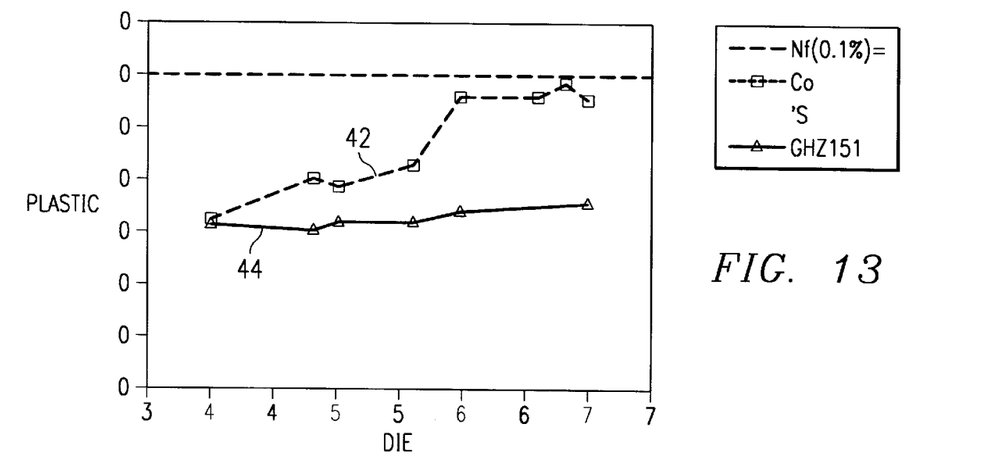
FIG. 13 illustrates a worst case strain prediction for conventional ball grid array and selectively depopulated ball grid array packages as a function of die size.
Figure 14:
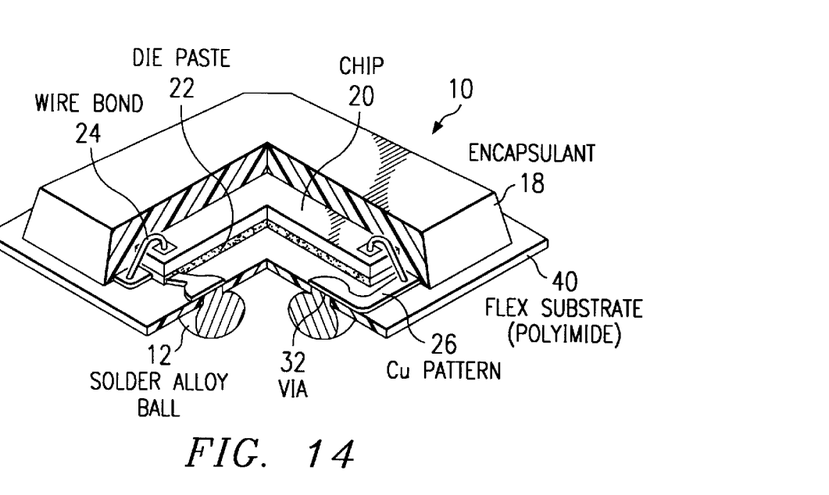
FIG. 14 is an exploded sectional view of a ball grid array (BGA) package, according to one embodiment of the invention.

The ability to model proposed solutions is invaluable in bringing new packages to market quickly. The TI 151 CSP 'Smart-Foot'™ package was modeled using a two-dimensional finite element analysis tool before any new tooling was committed. The model confirmed the proposed reliability benefit in advance. The 151 ball CSP 'Smart-Foot'™ package not only proved as reliable as the model predicted, but all reliability tests passed first time. FIG. 13 shows the worst case elastic strain prediction for both packages as a function of die size, and clearly shows a much lower strain in the case of the 'Smart-Foot'™ package.

Custom DSPs for wireless handsets frequently use packages with 144 contacts. The 144 TQFP package has been a high running package for these applications. As discussed in the Background, there is a clear need to reduce the size of traditional QFP packages to equivalent chip scale packages. Thus a 144 CSP was required. A 12×12 mm body 144 CSP with 0.80 mm ball pitch as been developed, and has been a high running CSP since 1997. As further package shrinks were required, the 0.50 mm pitch version, with a 10×10 mm body size needed to be developed. Today, 10×10 mm body packages with 0.50 mm pitch are available with both conventional and 'Smart-Foot'™ footprints.

As the need for smaller bodied packages continues, we will see more package designs following this innovative path. Already, 12×12 mm and 13×13 mm body 'Smart-Foot'™ packages are being designed for applications with higher total ball count.

With a somewhat 'custom' approach to package design, various criticisms can be anticipated:

1) That 'Smart-Foots'™ packages look unconventional, and do not conform to the footprints offered by other vendors. Fortunately, due to the high volume of Wireless applications, a somewhat 'custom' footprint is easily justified in the context of the reliability benefits.
2) That the board routability of such unusual footprints may be a problem. Actually, there is no added system cost penalty with this approach since routing of the 'Smart-Foot'™ footprint may actually be easier because of the spread out configuration. In the case of larger packages, such as 240 and 304 balls, additional care is necessary to ensure that board routability is not degraded, but such is easily accomplished.
3) That package cost will be higher. Other than a longer design cycle, cost of the 'Smart-Foot'™ packages is identical to packages with conventional footprints. The assembly processes are identical. The package materials used are the same in both cases. Furthermore there are examples where the 'Smart-Foot'™ avoids the use of higher cost substrate materials (requiring for example, two metal layers rather than the conventional one metal layer).
4) That there may be other additional system costs, other than the routability issue mentioned above. CSPs with inadequate reliability normally require the board assembler to add features to compensate for the package inadequacy. This normally involves an 'underfill' process, which is a method of using a glue between the component and the board. This glue relieves the stress from the solder balls, and distributes it across the entire surface area beneath the package. This is an effective technique, but adds significant cost. Thus use of higher reliability solutions such as the 'Smart-Foot' can save system level cost.

In conclusion, taking an innovative approach to package design using a 'Smart-Foot'™ package can provide several benefits.

1) A board level reliability improvement of 2–3 times that of conventional designs.
2) Potential for cost saving by avoiding additional processes such as underfill.
3) No additional costs are created for the package, the customer's board, or the customer's process.

What is claimed is:

1. A method for improving reliability of a ball grid array (BGA) package by reducing ball joint fatigue wherein multiple traces or lines are routed through space that is vacated as a result of selective depopulation of solder balls and their respective solder ball pads, vias and traces or lines from a foot print of said package.

2. The method of claim 1, wherein up to eight traces or lines are routed through space that is unused as a result of the depopulation of said solder balls and respective solder ball pads, vias and traces or lines when the 25 un line width rule is used.

3. The method of claim 1, wherein up to twelve traces or lines are routed through space that is unused as a result of the depopulation of said solder balls and respective solder ball pads, vias and traces or lines when the 18 um line width rule is used.

4. The method of claim 1, where the diameter of said vias is maintained at an optimum via design rule.

5. The method of claim 4, wherein said diameter is 280 um.

6. The method of claim 1, wherein the pitch of said solder balls is 500 um.

7. The method of claim 1, wherein said trace or line has a width of 18 um.

8. Method of claim 1, wherein the space width of said trace or line is 28 um.

9. A device, comprising:
a semiconductor die; and
a substrate, a first side of said substrate coupled to said die and a second side of said substrate having a selectively depopulated ball grid array in which multiple traces or lines coupling solder ball pads to said first side of said substrate are routed through space that is vacated as a result of the depopulation of solder balls and respective solder ball pads, vias and traces or lines, said substrate providing improved device reliability through a reduction in ball joint fatigue.

10. The device of claim 9, wherein said multiple traces or lines further extend to an exterior surface of said substrate.

11. The device of claim 9, wherein up to eight traces or lines are routed through space that is unused as a result of the depopulation of said solder balls and respective solder ball pads, vias and traces or lines when the 28 um line width rule is used.

12. The device of claim 9, wherein up to twelve traces or lines are routed through space that is unused as a result of the depopulation of said solder balls and respective solder ball pads, vias and traces or lines when the 18 um line width rule is used.

13. The device of claim 9, where the diameter of said vias is maintained at an optimum via design rule.

14. The device of claim 13, wherein said diameter is 280 um.

15. The device of claim 9, wherein the pitch of said solder balls is 500 um.

16. The device of claim 9, wherein said trace or line has a width of 18 um.

17. The device of claim 16, wherein the space width of said trace or line is 28 um.

18. The device of claim 9, wherein said device is a ball grid array (BGA) package.

19. A method for improving reliability of a ball grid array (BGA) package in which increased diameter vias are provided on the foot print of said package to reduce ball joint fatigue and multiple traces or lines are routed through space that is vacated as a result of selective depopulation of solder balls and their respective solder ball pads, vias and traces or lines from said foot print.

20. A method for improving reliability of a ball grid array (BGA) package wherein multiple traces or lines are routed through space that is vacated as a result of selective depopulation of solder balls and their respective solder ball pads, vias and traces or lines from a substrate of said package, said selective depopulation and trace or line routing facilitating use of larger diameter vias than is practical without said selective depopulation and trace or line routing.

21. A method for improving reliability of a ball grid array (BGA) package wherein multiple traces or lines are routed through space that is vacated as a result of selective depopulation of solder balls and their respective solder ball pads, vias and traces or lines from a substrate of said package, said selective depopulation and trace or line routing facilitating use of larger diameter vias than is permitted by optimum line/space design rules without said selective depopulation and trace or line routing.

22. A method for improving reliability of a ball grid array (BGA) package by reducing ball joint fatigue, wherein multiple traces or lines are routed through space that is vacated as a result of selective depopulation of solder balls and their respective solder ball pads, vias and traces or lines from a substrate of said package, said selective depopulation and trace or line routing facilitating use of larger diameter vias than is practical without said selective depopulation and trace or line routing.

23. A method for improving reliability of a ball grid array (BGA) package by reducing ball joint fatigue, wherein multiple traces or lines are routed through space that is vacated as a result of selective depopulation of solder balls and their respective solder ball pads, vias and traces or lines from a substrate of said package, said selective depopulation and trace or line routing facilitating use of larger diameter vias than is permitted by optimum line/space design rules without said selective depopulation and trace or line routing.

24. A device, comprising:

a semiconductor die; and a substrate, a first side of said substrate coupled to said die and a second side of said substrate and a selectively depopulated ball grid array in which multiple traces or lines coupling solder ball pads to said first side of said substrate are routed through space that is vacated as a result of the depopulation of solder balls and respective solder ball pads, vias and traces or lines, said selective depopulation and trace or line routing facilitating use of larger diameter vias than is practical without said selective depopulation and trace or line routing.

25. A device, comprising:

a semiconductor die; and a substrate, a first side of said substrate coupled to said die and a second side of said substrate and a selectively depopulated ball grid array in which multiple traces or lines coupling solder ball pads to said first side of said substrate are routed through space that is vacated as a result of the depopulation of solder balls and respective solder ball pads, vias and traces or lines, said selective depopulation and trace or line routing facilitating use of larger diameter vias than is permitted by line/space design rules without said selective depopulation and trace or line routing.

* * * * *